(12) United States Patent
Leem

(10) Patent No.: US 6,284,646 B1
(45) Date of Patent: Sep. 4, 2001

(54) METHODS OF FORMING SMOOTH CONDUCTIVE LAYERS FOR INTEGRATED CIRCUIT DEVICES

(75) Inventor: Hyeun-Seog Leem, Kyunggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 09/136,471

(22) Filed: Aug. 19, 1998

(30) Foreign Application Priority Data

Aug. 19, 1997 (KR) .................................................. 97-39346

(51) Int. Cl.[7] ................................................ H01L 21/4763
(52) U.S. Cl. ........................ 438/629; 438/679; 438/685; 438/688; 438/681; 438/672
(58) Field of Search ................ 257/750; 438/629, 438/679, 680, 681, 683, 685, 14, 16, 674, 688, 672

(56) References Cited

U.S. PATENT DOCUMENTS

| | | | |
|---|---|---|---|
| 5,472,505 | 12/1995 | Lee et al. | 118/715 |
| 5,871,805 * | 2/1999 | Lameleson | 427/8 |
| 5,963,835 * | 10/1999 | Sandhu et al. | 438/681 |
| 5,976,969 * | 10/1999 | Lin et al. | 438/629 |

FOREIGN PATENT DOCUMENTS 97-53223    7/1997  (KR) ............................. H01L/21/66

* cited by examiner

*Primary Examiner*—Matthew Smith
*Assistant Examiner*—Belur Keshaven
(74) *Attorney, Agent, or Firm*—Myers Bigel Sibley & Sajovec (57) ABSTRACT

A method for forming a metal layer for an integrated circuit device includes forming a first conductive layer on an integrated circuit substrate. While forming the first conductive layer, a reflection index of the first conductive layer is monitored, and the formation of the first conductive layer is terminated when the reflection index of the first conductive layer reaches a predetermined value. More particularly, the first conductive layer can be an aluminum layer having a thickness in the range of approximately 500 Angstroms to 1500 Angstroms.

28 Claims, 5 Drawing Sheets

METHODS OF FORMING SMOOTH CONDUCTIVE LAYERS FOR INTEGRATED CIRCUIT DEVICES

FIELD OF THE INVENTION

The present invention relates to integrated circuit devices and, more particularly to metal layers for integrated circuit devices.

BACKGROUND OF THE INVENTION

In semiconductor integrated circuit devices, alloys or multi-layered metallizations are used to provide metal interconnections between circuits of the integrated circuit devices. In particular, aluminum or an aluminum alloy is often used to provide the metal interconnections. A layer of aluminum or an aluminum alloy can be deposited on an insulating layer (such as a silicon oxide layer) of the integrated circuit device, and the aluminum or aluminum alloy layer can be deposited into openings such as contact holes, trenches, vias, and/or grooves in the insulating layer. The aluminum or aluminum alloy layer can then be patterned to provide metal interconnection lines of the insulating layer with interconnections to other layers through the openings in the insulating layer. Aluminum has been widely used because aluminum has a good electrical conductivity compared with other metals and low contact resistance with respect to silicon.

In the manufacture of integrated circuit (IC) devices, metal layers such as the aluminum or aluminum alloy layers discussed above have often be formed using physical vapor deposition (PVD) techniques such as sputtering. With the advent of very large scale integration (VLSI) integrated circuit devices, however, the diameters of openings within which the metal layers are deposited is being reduced and the aspect ratios of these openings is increasing. In other words, a ratio of the depth of these openings to the diameter of these openings is increasing. It may thus be difficult to form a metal layer by sputtering and also provide a uniform distribution of the metal layer around high aspect ratio openings (such as contact holes having submicron diameters) in the insulating layer due to shadow effects caused by substrate morphologies. Accordingly, it may be difficult to use physical vapor deposition techniques to form metal interconnection layers for very large scale integration (VLSI) and ultra large scale integration (ULSI) integrated circuit devices.

Chemical vapor deposition (CVD) techniques can be used to form metal interconnection layers with improved step coverage when compared to metal layers formed using physical vapor deposition techniques. In particular, it is possible to form and grow metal nuclei in a thin layer. Accordingly, there have been efforts to form metal interconnection layers using chemical vapor deposition techniques. In particular, there have been efforts to form aluminum interconnection layers using chemical vapor deposition techniques.

Aluminum layers formed using chemical vapor deposition techniques, however, may have an island-shape surface or otherwise rough surface morphology. Accordingly, it may be difficult to achieve uniform aluminum distribution in an opening such as a contact hole or via with a high aspect ratio, and it may be difficult to form long metal lines with uniform characteristics.

SUMMARY OF THE INVENTION

It is therefore an object of the present invention to provide improved methods and systems for forming metal layers for integrated circuit devices.

It is another object of the present invention to provide methods and systems for forming metal layers having improved surface characteristics.

It is still another object of the present invention to provide methods and systems for reducing the formation of voids in metal layers formed in high aspect ratio openings such as contact holes and vias.

It is yet another object of the present invention to provide methods and systems for forming metal layers having improved step coverage.

These and other objects are provided according to the present invention by monitoring a reflection index of the first conductive layer while forming the first conductive layer, and terminating formation of the first conductive layer when the reflection index of the first conductive layer reaches a predetermined value. The conductive layer thus formed has a relatively smooth and planar surface thus providing a conductive layer with uniform thickness. A smooth composite layer of a desired thickness can thus be provided by forming a plurality of these layers to provide a composite layer of the desired thickness which can be patterned to provide relatively long conductive lines with uniform thickness.

More particularly, a single conductive layer formed according to the present invention can have a thickness in the range of approximately 500 Angstroms to 1500 Angstroms, and the conductive layer can be a layer of aluminum. In addition, each of the conductive layers can be separated by a buffer layer wherein the buffer layer comprises a material different than that of the first conductive layer.

The buffer layer may have a thickness less than a thickness of the first conductive layer, and the buffer layer preferably has a thickness of no more than approximately 100 Angstroms. Moreover, the buffer layer can be a layer of a material such as copper (Cu), zinc (Zn), titanium (Ti), tungsten (W), tantalum (Ta), titanium nitride (Ti—N), tungsten nitride (Ti—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), and combinations thereof.

The methods and systems of the present invention can thus be used to provide relatively smooth and planar conductive aluminum layers by terminating formation of the individual aluminum layer when a reflection index thereof reaches a predetermined value. In addition, a desired thickness of a conductive layer can be achieved by forming a composite layer including a plurality of aluminum layers according to the present invention with each aluminum layer being separated by a thin conductive buffer layer.

The characteristics of a metal line formed using CVD techniques is dependent on the deposition conditions used. When the deposition precursor is a metalorganic compound, the thermal decomposition temperature of the deposition precursor varies according to the bonding characteristics of the deposition precursor. The CVD deposition rate is classified to two regions according to the deposition temperature. The deposition rate of a low temperature deposition region is largely determined based on the surface reaction of the substrate. On the other hand, the deposition rate of a high temperature deposition region is largely determined based on the gas flow rates. The deposition rates increase in proportion to increasing temperature in the low temperature deposition region (region of controlling the surface reaction), while the deposition rate is not significantly affected by the temperature in the high temperature deposition region (region of controlling delivering flow rate) thus maintaining almost a constant deposition rate.

Because relatively good step coverage is provided in the region of controlling the surface reaction when using chemical vapor deposition (CVD), chemical vapor deposition is used mainly in the region of controlling the surface reaction to overcome disadvantages of physical vapor deposition which may provide relatively poor step coverage. When using dimethyl amine alane as a deposition precursor, for example, the thermal decomposition temperature can be approximately 80° C. or less, and the temperature of the region of controlling the surface reaction can be approximately 200° C. or less.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of the layers and regions are exaggerated for clarity. Like numbers refer to like elements throughout. It will also be understood that when a layer is referred to as being "on" another layer or substrate, it can be directly on the other layer or substrate, or intervening layers may also be present. In contrast, when an element is referred to as being "directly on" another element, there are no intervening elements present.

Figure 1:
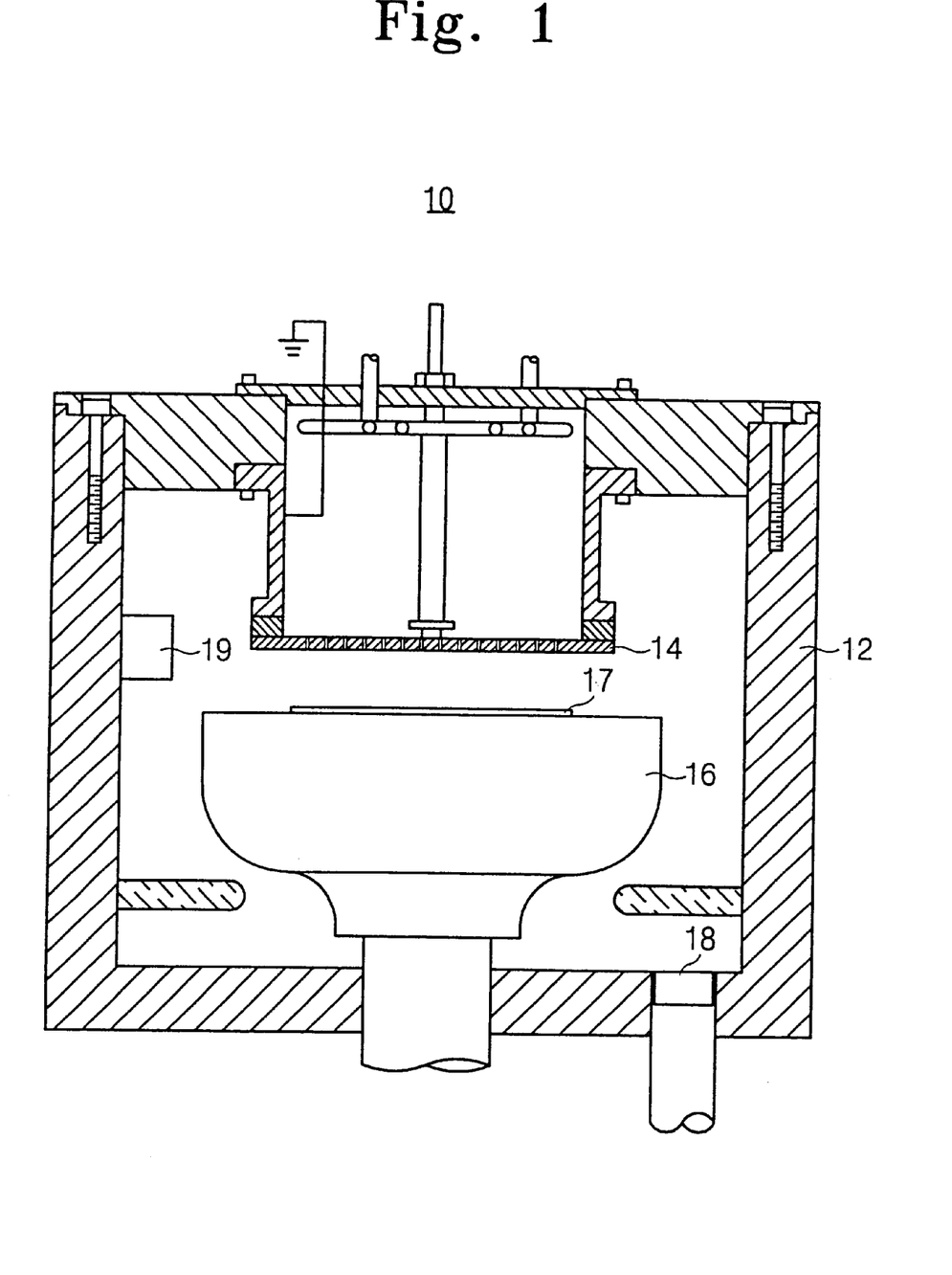
FIG. 1 is a cross-sectional view of a CVD apparatus used to form metal layers according to the present invention.

FIG. 1 is a cross sectional view of a chemical vapor deposition (CVD) reactor with a gas-dispensing showerhead in a reaction chamber. During deposition, an integrated circuit substrate (or wafer) 17 is placed on a susceptor 16 in deposition chamber housing 12 of the CVD reactor 10. Various reactant gases are introduced into the chamber housing 12 through a gas supply system by way of the gas-dispensing showerhead 14. The reactant gases are mixed together around the substrate 17 and give rise to chemical reaction on an exposed surface of the substrate 17. The chemical reaction of the gases results in the deposition of one or more materials on the exposed surface of the substrate 17, thus forming a layer thereon. The gases not participating in the chemical reaction are driven out of the chamber housing 12 through a vacuum opening 18. The CVD reactor also includes a reflection index monitor 19 that monitors a reflection index of the exposed surface of the substrate 17 including any layers thereon. In particular, the CVD reactor of FIG. 1 can be used to form metal layers, such as aluminum layers to provide circuit interconnections for highly integrated IC devices.

The CVD reactor can be used to form an aluminum layer using dimethyl ethyl amine alane as a deposition precursor. In particular, the temperature of the dimethyl ethyl amine alane can be maintained in a range of approximately room temperature (25° C.) to 35° during deposition, and the dimethyl ethyl amine alane can be mixed with a reactant gas such as argon (Ar) or hydrogen ($H_2$). The flow rate of the reactant gas can be in the range of approximately 0 sccm to 500 sccm. Under these conditions, nuclei of aluminum crystal are grown to form a thin layer on a surface of a silicon substrate. At this time, the thin aluminum layer has a reflection index of approximately 93% in comparison to a reflection index of 100% for a polished silicon substrate.

If growth is continued, the thin aluminum layer may grow planarly in two dimensions, and the reflection index of the thin aluminum layer may be reduced to approximately 61%. If growth of the thin aluminum layer is continued, the thin aluminum film can grow continuously to have a thickness in the range of approximately 500 Angstroms to 1500 Angstroms, and preferably a thickness of approximately 800 Angstroms. Moreover, a thin aluminum layer grown to this thickness under the conditions discussed above can have a reflection index of approximately 214%. In other words, the reflection index of this thin aluminum layer can be approximately two times that of a bare polished silicon substrate.

If the deposition of aluminum continues, the thin aluminum layer of two dimensional phase may grow three dimensionally, thus resulting in irregular growth of the aluminum layer. In other words, the aluminum layer may have a non-uniform surface morphology. More particularly, if the aluminum layer is grown continuously to have a thickness of approximately 1700 Angstroms, the reflection index of the aluminum layer may be reduced to approximately 140%.

As discussed above, an thin aluminum layer having a thickness in the range of approximately 500 Angstroms to 1500 Angstroms, and preferably approximately 800 Angstroms, formed using CVD techniques can have excellent surface characteristics with a reflection index of approximately two times greater than that of a bare polished silicon substrate. Because non-uniform surface morphologies may result with thicknesses greater than approximately 1500 Angstroms and because thickness of most metal lines are greater than 1500 Angstroms, it may be difficult to achieve an aluminum interconnection line of a desire thickness with a smooth and planarized surface.

Accordingly, methods and systems of the present invention can be used to provide relatively thick aluminum layers with smooth and planar surfaces, and the aluminum layers thus formed can be patterned to provide aluminum interconnection lines of sufficient conductivity, smoothness, and planarity. In particular, the aluminum layer is formed using a CVD technique wherein the step of forming the aluminum layer is terminated when the reflection index of the aluminum layer reaches predetermined value. Preferably the step of forming the aluminum layer is terminated when the reflection index of the aluminum layer reaches its maximum value, and this may occur when the reflection index of the aluminum layer is approximately two times that of a bare polished silicon wafer.

More particularly, the aluminum layer can be formed according to the present invention using a metalorganic compound as a deposition precursor, wherein the metalorganic compound can be, for example, triisobutyl aluminum, dimethyl aluminum hydride, trimethyl aluminum, or dimethyl ethyl amine alane. The pressure inside the reactor chamber during deposition can be in the range of approximately 0.1 Torr to 5 Torr, and the temperature of the substrate during deposition can be in the range of approximately 100° C. to 300° C. A gas such as argon (Ar) or hydrogen ($H_2$) can be used as a reactant gas, and the flow rate of the reactant gas can be in the range of approximately 0 sccm to 500 sccm. At this time, the surface of the substrate 17 and the showerhead 14 can be spaced from each other in the range of approximately 10 mm to 50 mm.

Alternatively, prior to forming the aluminum layer, a diffusion barrier layer can be formed on the substrate. The diffusion barrier layer provides a barrier for aluminum diffusion without significantly increasing contact resistances. The diffusion barrier layer is formed, for example, using chemical vapor deposition (CVD) techniques, physical vapor deposition (PVD) techniques, atomic layer deposition (ALD) techniques, atomic layer epitaxy (ALE) techniques, or thermal treatment using various gasses such as, for example, silane ($SiH_4$), tungsten hexaflouride ($WF_6$), diborane ($B_2H_6$), or titanium chloride ($TiCl_4$). The diffusion barrier layer can include a layer of copper (Cu), zinc (Zn), titanium (Ti), tungsten (W), tantalum (Ta), titanium nitride (Ti—N), tungsten nitride (W—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), or combinations thereof.

A buffer layer, such as a layer of titanium nitride (TiN) for example, which provides for formation of aluminum nuclei thereon, can be formed on the aluminum layer. This buffer layer preferably has a thickness of approximately 100 Angstroms or less, and is preferably thinner than the aluminum layer. The buffer layer is made of a material or materials that do not significantly effect the electrical characteristics of the aluminum layer. For example, the buffer layer can include a layer of a metal, a metal alloy, an alloy of a metal and a semiconductor, or combinations thereof. For example, the buffer layer can include a layer of a material such as copper (Cu), zinc (Zn), titanium (Ti), tungsten (W), tantalum (Ta), titanium nitride (Ti—N), tungsten nitride (W—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), or combination thereof. The buffer film can be made, for example, using chemical vapor deposition CVD techniques, physical vapor deposition (PVD) techniques, atomic layer deposition (ALD) techniques, or atomic layer epitaxy (ALE) techniques.

A second aluminum layer can then be formed on the buffer layer using the steps discussed above with regard to the first aluminum layer. In other words, the steps of forming the aluminum layer and buffer layer can be repeated one or more times to form a smooth and planar metal layer having a desired thickness. The metal layer thus formed can be patterned to provide relatively long interconnection lines with a desired conductivity and uniformity.

Figure 2A:
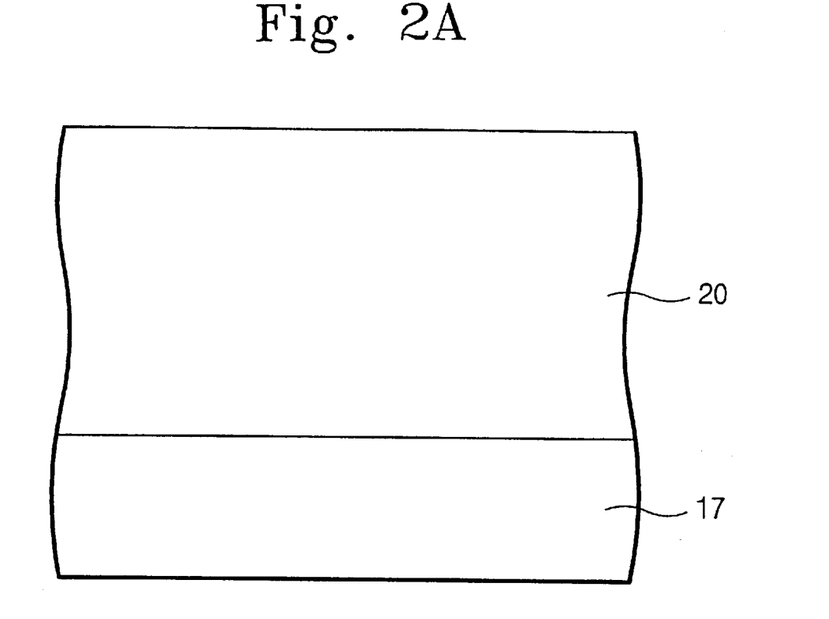
FIGS. 2A to 2C are cross sectional views illustrating steps of a method for filling a high aspect ratio contact hole according the present invention.
Figure 2B:
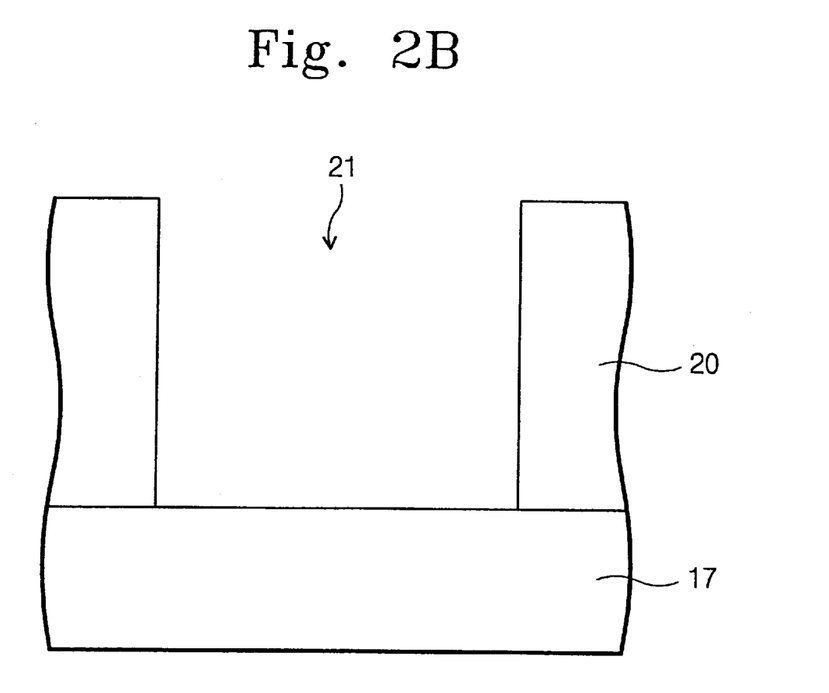
Figure 2C:
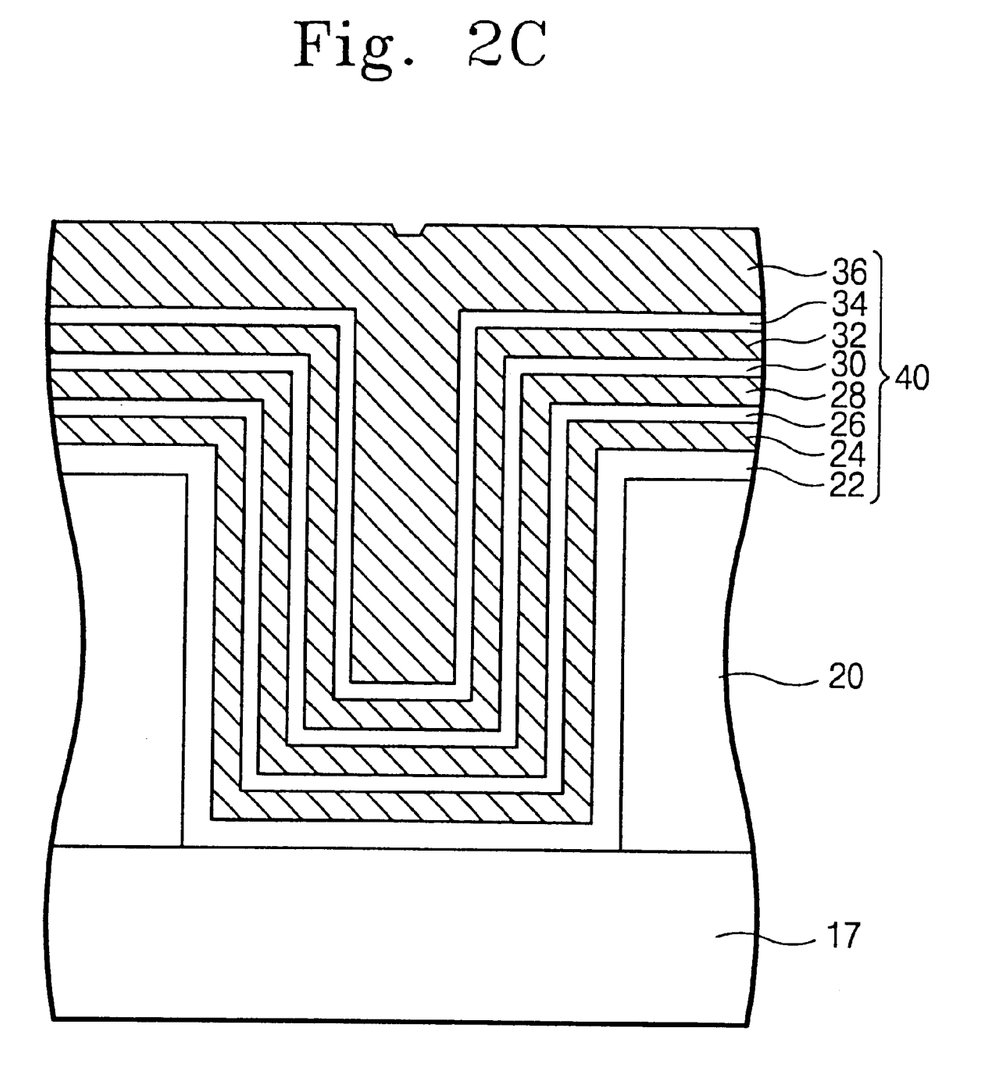

FIGS. 2A to 2C are cross sectional views illustrating steps of a method of forming a metal layer on an insulating layer including a high aspect ratio contact hole therein according to the present invention. As shown in FIG. 2A, an insulating layer 20, such as a boro phosphosilicate glass (BPSG) layer, is formed on the substrate 17. An opening 21 is formed in the insulating layer 20 by etching the insulating layer 20, thus exposing the substrate 17 through the opening 21, as shown in FIG. 2B.

Referring to FIG. 2C, a diffusion barrier layer 22 is formed on the bottom and both sidewalls of the opening 21. The diffusion barrier layer 22 can be formed, for example, using chemical vapor deposition (CVD) techniques, physical vapor deposition (PVD) techniques, atomic layer deposition (ALD) techniques, or atomic layer epitaxy (ALE) techniques. The diffusion barrier layer 22 can be a layer of a material such as copper (Cu), zinc (Zn), titanium (Ti), tungsten (W), tantalum (Ta), titanium nitride (Ti—N), tungsten nitride (W—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), or combinations thereof.

A first conductive layer 24 (for example an aluminum layer) is formed on the diffusion barrier layer 22, wherein the forming of the first conductive layer 24 is terminated when the reflection index of the first conductive layer 24 reaches a predetermined value. The forming of the first conductive layer 24 is preferably terminated when the reflection index thereof reaches its maximum value which may be approximately two times a reflection index of a bare polished silicon substrate. During the forming of the first conductive layer 24, a distance between the showerhead 14 and the surface of the substrate 17 is preferably maintained in the range of approximately 10 mm to 50 mm. The pressure within the reacting chamber can be in the range of approximately 0.1 Torr to 5 Torr, and the temperature of the substrate can be in the range of approximately 100° C. to 350° C. A gas such as argon (Ar) or hydrogen ($H_2$) can be used as a reactant gas, and a flow rate of the reactant gas can be in the range of approximately 0 sccm to 500 sccm.

A buffer layer 26 having a thickness of approximately 100 Angstroms or less is formed on the first conductive layer 24. The buffer layer 26 is preferably a layer of a material having no significant effect on electrical characteristics of the composite layer including layers 24 and 26 and other conductive layers formed subsequently thereon. The buffer layer 26 also preferably provides for the formation of nuclei of the material used to form the conductive layer 28 thereon. The buffer layer 26 can be a layer of a metal, an alloy of metals, an alloy of a metal and a semiconductor, or combinations thereof. For example, the buffer layer 26 can be a layer of a material such as copper (Cu), zinc (Zn), titanium (Ti), tungsten (W), tantalum (Ta), titanium nitride (Ti—N), tungsten nitride (W—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), or combinations thereof.

A second conductive layer 28, such as an aluminum layer, is formed on the buffer layer 26, wherein the forming of the second conductive layer 28 is terminated when the reflection index of the second conductive layer 28 reaches predetermined value. This predetermined value of the reflection index is preferably the maximum reflection index achieved as the second conductive layer is formed which can be approximately two times the reflection index of a bare polished silicon layer.

Additional conductive layers 32 and 36 and alternating buffer layers 30 and 34 can be formed repeatedly using the methods discussed above to provide a smooth and planar composite (or laminated) conductive layer of a desired thickness. In particular, each of the subsequent conductive layers is formed on a respective buffer layer, and the formation of each conductive layer is terminated when a reflective index thereof reaches a predetermined value. More particularly, each conductive layer preferably has a thickness in the range of approximately 500 Angstroms to 1500 Angstroms, and each of the buffer layers preferably has a thickness of less than approximately 100 Angstroms so that the overall thickness of the completed composite conductive layer can be determined by the number of conductive and buffer layers thus formed.

Figure 3:
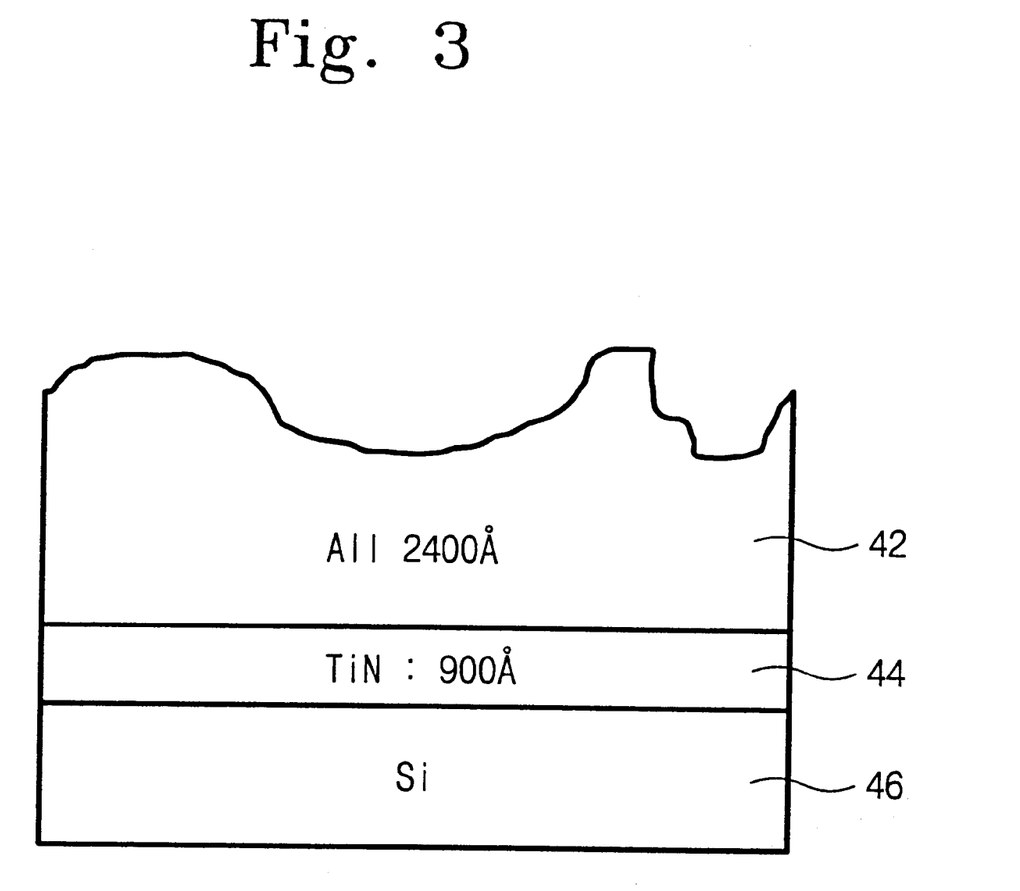
FIG. 3 is a cross sectional view of a structure including a 2400 Angstrom thick aluminum layer and a 900 Angstrom thick titanium nitride layer formed on a bare silicon substrate.

FIG. 3 is a cross sectional view of a structure including a 900 Angstrom thick titanium nitride (TiN) layer 44 and a 2400 Angstrom thick aluminum (Al) layer 42 formed on a bare silicon substrate 46. In the structure of FIG. 3, the surface of the aluminum layer 42 is relatively rough and non-planar, and the reflection index thereof is relatively low.

Figure 4:
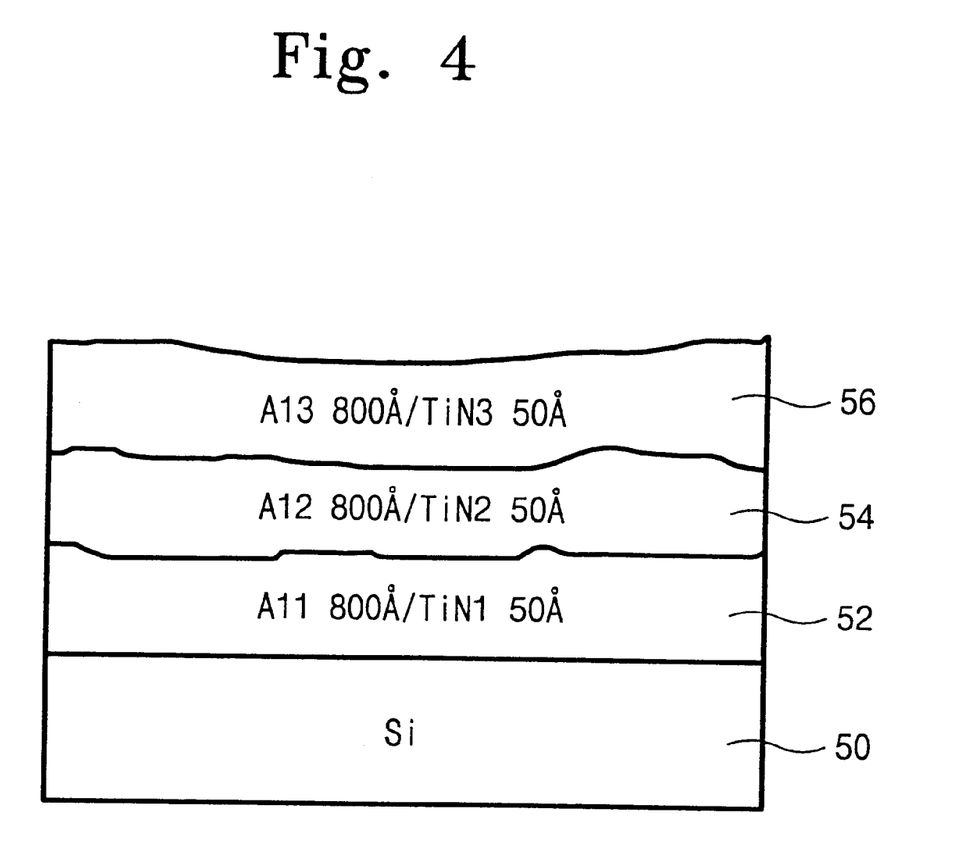
FIG. 4 is a cross sectional view of a structure including three layers on a bare silicon substrate wherein each layer includes an 800 Angstrom thick aluminum layer and a 50 Angstrom thick titanium nitride layer.

FIG. 4 is a cross sectional view of a structure including three 800 Angstrom thick conductive Aluminum sub-layers each separated by a respective 50 Angstrom thick conductive titanium nitride buffer layer on a bare silicon subsrate 50 formed using the steps discussed above with regard to FIGS. 2A–C. Accordingly, each of the respective layers 52, 54, and 56 includes a respective 800 Angstrom thick conductive aluminum sub-layer on a respective 50 Angstrom thick titanium nitride buffer layer.

In comparing the surfaces of the structures illustrated in FIGS. 3 and 4, the reflection index of the surface of the structure of FIG. 3 is approximately 84% while the reflection index of the surface of the structure of FIG. 4 formed according to the present invention is in the range of approximately 206% to 210%. Moreover, the surface of the structure of FIG. 4 formed according to the present invention is more planar and smooth than that of the surface of the structure of FIG. 3. In particular, the reflection index (RI) of the aluminum sub-layer of layer 52 can be approximately 206%; the reflection index (RI) of the aluminum sub-layer of layer 54 can be approximately 208%; and the reflection index (RI) of the aluminum sub-layer of layer 56 can be approximately 210%.

In the drawings and specification, there have been disclosed typical preferred embodiments of the invention, and although specific terms are employed, they are used in a generic sense only and not for purposes of limitation, the scope of the invention being set forth in the following claims.

That which is claimed is:

1. A method for forming a metal layer for an integrated circuit device, the method comprising the steps of:

forming a first conductive layer on an integrated circuit substrate wherein the first conductive layer comprises aluminum;

while forming the first conductive layer, monitoring a reflection index of the first conductive layer comprising aluminum; and terminating forming the first conductive layer comprising aluminum when the reflection index of the first conductive layer reaches a predetermined value.

2. A method according to claim 1 wherein the step of terminating forming the first conductive layer is followed by the steps of:

forming a second conductive layer on the first conductive layer opposite the substrate;

while forming the second conductive layer, monitoring a reflection index of the second conductive layer; and terminating forming the second conductive layer when the reflection index of the second conductive layer reaches a second predetermined value.

3. A method according to claim 2 wherein the step of terminating forming the second conductive layer is followed by the step of:

patterning the first and second conductive layers to form a conductive line on the substrate, the conductive line comprising a laminated structure including the first and second patterned conductive layers.

4. A method according to claim 2 wherein the first and second conductive layers each have a thickness in the range of approximately 500 Angstroms to 1500 Angstroms.

5. A method according to claim 2 wherein the first and second conductive layers comprise aluminum.

6. A method according to claim 2 wherein the first and second conductive layers are formed using chemical vapor deposition (CVD).

7. A method according to claim 2 wherein the step of forming the second conductive layer is preceded by the step of:

forming a buffer layer on the first conductive layer opposite the substrate after terminating forming the first conductive layer wherein the buffer layer comprises a material different than that of the first conductive layer.

8. A method according to claim 7 wherein the buffer layer comprises a material chosen from the group consisting of copper (Cu), zinc (Zn), titanium (Ti), tungsten (W), tantalum (Ta), titanium nitride (Ti—N), tungsten nitride (Ti—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), and combinations thereof.

9. A method according to claim 7 wherein the buffer layer is formed using a technique chosen from the group consisting of physical vapor deposition (PVD), chemical vapor deposition (CVD), atomic layer deposition (ALD), atomic layer epitaxy (ALE), and thermal treatment.

10. A method according to claim 7 wherein the step of forming the buffer layer comprises exposing the substrate to a gas chosen from the group consisting of silane ($SiH_4$), tungsten hexaflouride ($WF_6$), diborane hexaflouride ($B_2H_6$), and titanium chloride ($TiCl_4$).

11. A method according to claim 7 wherein the step of forming the buffer layer comprises maintaining the substrate at a temperature in the range of approximately 100° C. to 350° C. while forming the buffer layer.

12. A method according to claim 2 wherein the step of terminating forming the second conductive layer is followed by the steps of:

forming a third conductive layer on the second conductive layer opposite the substrate;

while forming the third conductive layer, monitoring a reflection index of the third conductive layer; and terminating forming the third conductive layer when the reflection index of the third conductive layer reaches a third predetermined value.

13. A method according to claim 1 wherein the first conductive layer is formed using chemical vapor deposition.

14. A method according to claim 1 wherein the first conductive layer comprises aluminum.

15. A method according to claim 14 wherein the first conductive aluminum layer has a thickness in the range of approximately 500 Angstroms to 1500 Angstroms after terminating forming the first conductive aluminum layer.

16. A method according to claim 1 wherein the predetermined value of the reflection index of the first conductive layer is a maximum reflection index of the first conductive layer.

17. A method according to claim 1 wherein the step of forming the first conductive layer is preceded by the steps of:
  forming an insulating layer on the integrated circuit substrate wherein the insulating layer has a contact hole therein exposing a portion of the integrated circuit substrate; and
  forming a diffusion barrier layer on the exposed portion of the integrated circuit substrate and on a sidewall of the contact hole.

18. A method according to claim 17 wherein the diffusion barrier layer comprises a material chosen from the group consisting of copper (Cu), zinc (Zn); titanium (Ti), tungsten (W), tantalum (Ta), titanium nitride (Ti—N), tungsten nitride (Ti—N), tantalum nitride (Ta—N), titanium silicon nitride (Ti—Si—N), titanium boron nitride (Ti—B—N), titanium aluminum nitride (Ti—Al—N), tungsten boron nitride (W—B—N), tungsten silicon nitride (W—Si—N), tungsten aluminum nitride (W—Al—N), tantalum silicon nitride (Ta—Si—N), tantalum boron nitride (Ta—B—N), tantalum aluminum nitride (Ta—Al—N), and combinations thereof.

19. A method according to claim 17 wherein the diffusion barrier layer is formed using a technique chosen from the group consisting of physical vapor deposition (PVD), chemical vapor deposition (CVD), atomic layer deposition (ALD), atomic layer epitaxy (ALE), and thermal treatment.

20. A method according to claim 17 wherein the step of forming the diffusion barrier layer comprises exposing the substrate to a gas chosen from the group consisting of silane ($SiH_4$), tungsten hexaflouride ($WF_6$), diborane hexaflouride ($B_2H_6$), and titanium chloride ($TiCl_4$).

21. A method according to claim 17 wherein the step of forming the diffusion barrier layer comprises maintaining the substrate at a temperature in the range of approximately 100° C. to 350° C. while forming the diffusion barrier layer.

22. A method for forming a metal layer for an integrated circuit device, the method comprising the steps of:
  forming a first conductive layer on an integrated circuit substrate;
  while forming the first conductive layer, monitoring a reflection index of the first conductive layer;
  terminating forming the first conductive layer when the reflection index of the first conductive layer reaches a predetermined value;
  forming a buffer layer on the first conductive layer opposite the substrate after terminating forming the first conductive layer wherein the buffer layer comprises a material different than that of the first conductive layer, wherein the buffer layer has a thickness less than a thickness of the first conductive layer;
  after forming the buffer layer, forming a second conductive layer on the buffer layer opposite the substrate;
  while forming the second conductive layer, monitoring a reflection index of the second conductive layer; and
  terminating forming the second conductive layer when the reflection index of the second conductive layer reaches a second predetermined value.

23. A method for forming a metal layer for an integrated circuit device, the method comprising the steps of:
  forming a first conductive layer on an integrated circuit substrate;
  while forming the first conductive layer, monitoring a reflection index of the first conductive layer;
  terminating forming the first conductive layer when the reflection index of the first conductive layer reaches a predetermined value;
  forming a buffer layer on the first conductive layer opposite the substrate after terminating forming the first conductive layer wherein the buffer layer comprises a material different than that of the first conductive layer, wherein the buffer layer has a thickness of no more than approximately 100 Angstroms;
  after forming the buffer layer, forming a second conductive layer on the buffer layer opposite the substrate;
  while forming the second conductive layer, monitoring a reflection index of the second conductive layer; and
  terminating forming the second conductive layer when the reflection index of the second conductive layer reaches a second predetermined value.

24. A method of forming a conductive layer on an integrated circuit substrate, the method comprising the steps of:
  forming a first aluminum layer on the integrated circuit substrate wherein the step of forming the first aluminum layer comprises,
    monitoring a reflection index of the first aluminum layer while forming the first aluminum layer, and
    terminating forming the first aluminum layer when the reflection index of the first aluminum layer reaches a predetermined value;
  forming a conductive buffer layer on the first aluminum layer opposite the substrate wherein the conductive buffer layer comprises a material other than aluminum; and
  forming a second aluminum layer on the conductive buffer layer opposite integrated circuit substrate and the first aluminum layer.

25. A method according to claim 24 wherein the first and second aluminum layers each have thicknesses in the range of approximately 500 Angstroms to 1500 Angstroms.

26. A method of forming a conductive layer on an integrated circuit substrate, the method comprising the steps of:
  forming a first aluminum layer on the integrated circuit substrate;
  forming a conductive buffer layer on the first aluminum layer opposite the substrate wherein the conductive buffer layer comprises a material other than aluminum wherein the conductive buffer layer has a thickness of not more than approximately 100 Angstroms, and
  forming a second aluminum layer on the conductive buffer layer opposite integrated circuit substrate and the first aluminum layer.

27. A method according to claim 26 wherein the step of forming the first aluminum layer comprises:

monitoring a reflection index of the first aluminum layer while forming the first aluminum layer; and terminating forming the first aluminum layer when the reflection index of the first aluminum layer reaches a predetermined value.

28. A method of forming a conductive layer on an integrated circuit substrate, the method comprising the steps of:

forming a first aluminum layer on the integrated circuit substrate;

forming a conductive buffer layer on the first aluminum layer opposite the substrate wherein the conductive buffer layer comprises a material other than aluminum wherein the conductive buffer layer has a thickness less than a thickness of the first aluminum layer; and forming a second aluminum layer on the conductive buffer layer opposite integrated circuit substrate and the first aluminum layer.

* * * * *